United States Patent
Kim et al.

(10) Patent No.: US 9,293,332 B2
(45) Date of Patent: Mar. 22, 2016

(54) SELECTIVE CRYSTALLIZATION METHOD AND LASER CRYSTALLIZATION APPARATUS USED IN THE SELECTIVE CRYSTALLIZATION METHOD

(75) Inventors: Do-Young Kim, Yongin (KR); June-Woo Lee, Yongin (KR); Won-Kyu Lee, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 939 days.

(21) Appl. No.: 13/371,105

(22) Filed: Feb. 10, 2012

(65) Prior Publication Data
US 2012/0244722 A1 Sep. 27, 2012

(30) Foreign Application Priority Data
Mar. 25, 2011 (KR) .......................... 10-2011-0026984

(51) Int. Cl.
| H01L 21/02 | (2006.01) |
| H01L 21/268 | (2006.01) |
| B23K 26/067 | (2006.01) |
| B23K 26/10 | (2006.01) |

(52) U.S. Cl.
CPC ............ *H01L 21/268* (2013.01); *B23K 26/064* (2013.01); *B23K 26/0676* (2013.01); *B23K 26/10* (2013.01); *H01L 21/0237* (2013.01); *H01L 21/02675* (2013.01); *H01L 21/02678* (2013.01); *H01L 21/02691* (2013.01)

(58) Field of Classification Search
CPC ................................................ H01L 21/02675
USPC ................... 438/166, 487, 795; 257/E21.347
See application file for complete search history.

(56) References Cited

U.S. PATENT DOCUMENTS

| 5,485,019 A * | 1/1996 | Yamazaki et al. ............... 257/57 |
| 7,364,952 B2 | 4/2008 | Im |
| 7,691,687 B2 | 4/2010 | Im |
| 2005/0059224 A1* | 3/2005 | Im ................................. 438/487 |
| 2007/0042575 A1* | 2/2007 | Lee et al. ........... B23K 26/0604 438/488 |
| 2011/0223698 A1* | 9/2011 | Jin et al. .......................... 438/34 |
| 2012/0012760 A1* | 1/2012 | Lee et al. .............. H01L 21/268 250/492.22 |
| 2013/0017630 A1* | 1/2013 | Seong-Hyun et al. ........ 438/166 |

FOREIGN PATENT DOCUMENTS

| KR | 1020050064367 | 6/2005 |
| KR | 1020080077794 | 8/2008 |
| KR | 20120111759 A | * 10/2012 |

* cited by examiner

*Primary Examiner* — Bac Au
*Assistant Examiner* — Toniae Thomas
(74) *Attorney, Agent, or Firm* — Knobbe Martens Olson & Bear LLP (57) ABSTRACT

A selective crystallization method includes placing a first substrate including first crystallization regions on a second substrate including second crystallization regions such that the first crystallization regions and the second crystallization regions are arranged alternately, and crystallizing the alternately-arranged first crystallization regions and the second crystallization regions with a laser beam. A laser crystallization apparatus can be used in the selective crystallization method.

10 Claims, 11 Drawing Sheets

SELECTIVE CRYSTALLIZATION METHOD AND LASER CRYSTALLIZATION APPARATUS USED IN THE SELECTIVE CRYSTALLIZATION METHOD

CROSS-REFERENCE TO RELATED APPLICATIONS

This application claims priority from Korean Patent Application No. 10-2011-0026984 filed on Mar. 25, 2011 in the Korean Property Office, the disclosure of which is incorporated herein by reference in its entirety.

BACKGROUND

1. Field

The present disclosure relates to a selective crystallization method and a laser crystallization apparatus used in the selective crystallization method, and more particularly, to a selective crystallization method which can improve the productivity of a crystallization process and a laser crystallization apparatus used in the selective crystallization method.

2. Description of the Related Technology

A substrate having thin-film transistors (TFTs) formed thereon is being used in active matrix displays. In particular, a TFT using a polycrystalline semiconductor film is capable of operating at high speed due to its high electron mobility compared to a TFT using an amorphous semiconductor film. Accordingly, a lot of research is being conducted on the technique of forming a semiconductor film with a crystalline structure by crystallizing an amorphous semiconductor film formed on an insulating substrate such as a glass substrate.

For crystallization, thermal annealing using furnace annealing, rapid thermal annealing, laser annealing, or a combination of these methods can be used. One substrate material applicable in crystallization is quartz, which has a superior heat-resisting property. However, quartz is expensive and hard to be processed into a large-sized substrate. This may explain the trend toward the use of a glass substrate. A glass substrate is economical, highly workable, and easy to be manufactured into a large-sized substrate. However, the glass substrate is susceptible to thermal deformation due to its low thermal resistance.

SUMMARY OF CERTAIN INVENTIVE ASPECTS

Aspects of the present disclosure provide a selective crystallization method which can improve the productivity of a crystallization process.

Aspects of the present disclosure also provide a laser crystallization apparatus applicable to a selective crystallization method which can improve the productivity of a crystallization process.

However, aspects of the present invention are not restricted to the ones set forth herein. The above and other aspects will become more apparent to one of ordinary skill in the art by referencing the detailed description given below.

According to one aspect, there is provided a selective crystallization method which includes placing a first substrate on a second substrate, where the first substrate includes first crystallization regions and the second substrate includes second crystallization regions, such that the first crystallization regions and the second crystallization regions are arranged alternately, and crystallizing the alternately arranged crystallization regions with a laser beam.

According to another aspect, there is provided a selective crystallization method which includes placing a first substrate having first crystallization regions on a second substrate having second crystallization regions such that the first crystallization regions and the second crystallization regions are arranged alternately, and simultaneously crystallizing the first crystallization regions and the second crystallization regions by irradiating a laser beam to the first substrate and the second substrate, wherein the laser beam is split into a first sub-laser beam and a second sub-laser beam which are simultaneously irradiated to the first crystallization regions and the second crystallization regions.

According to another aspect, there is provided a laser crystallization apparatus which includes a stage including a lower stage on which a lower substrate is mounted and an upper stage on which an upper substrate is mounted, wherein the upper stage includes a plurality of first supports separated from each other and extending parallel to each other in a first direction, a plurality of second supports separated from each other and extending parallel to each other in a direction perpendicular to the first direction, and light transmission portions formed by intersection of the first supports and the second supports.

BRIEF DESCRIPTION OF THE DRAWINGS

The above and other features and advantages will become more apparent by describing in detail certain embodiments with reference to the attached drawings in which.

DETAILED DESCRIPTION OF CERTAIN INVENTIVE EMBODIMENTS

Embodiments of the present invention will now be described more fully hereinafter with reference to the accompanying drawings. This invention may, however, be embodied in different forms and should not be construed as limited to the embodiments set forth herein. Rather, these embodiments are provided so that this disclosure will be thorough and complete, and will filly convey the scope of the invention to those skilled in the art. The same reference numbers generally indicate the same components throughout the specification. In the attached figures, the thickness of layers and regions may be exaggerated for clarity.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments of the present invention will be described with reference to perspective views, cross-sectional views, and/or plan views, in which preferred embodiments of the invention are shown. Thus, the profile of an exemplary view may be modified according to manufacturing techniques and/or allowances. That is, the embodiments of the invention are not intended to limit the scope of the present invention but cover all changes and modifications that can be caused due to a change in manufacturing process. Thus, regions shown in the drawings are illustrated in schematic form and the shapes of the regions are presented simply by way of illustration and not as a limitation.

Hereinafter, an embodiment of a selective crystallization method will be described with reference to FIG. 1.

As described above, a glass substrate may be susceptible to thermal deformation due to its low thermal resistance. Therefore, a laser may be used in a crystallization process performed on a glass substrate. A laser can provide high energy only to crystallization regions without excessively changing the temperature of a substrate.

Figure 1:
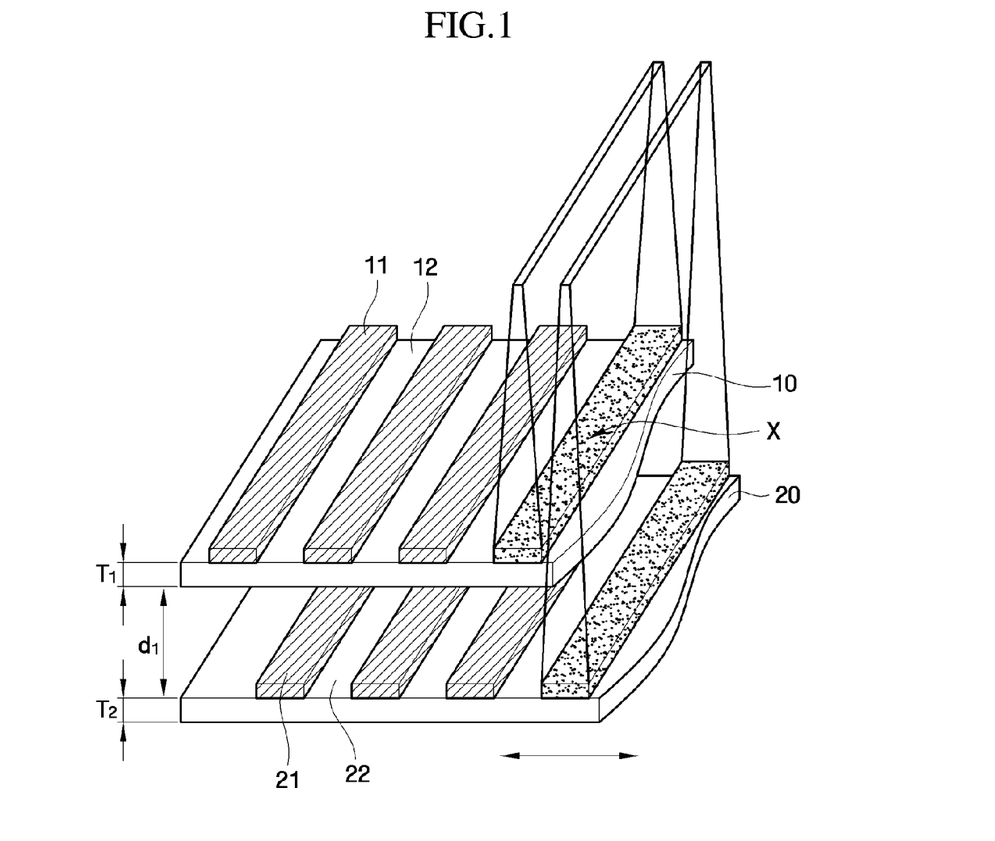
FIG. 1 is a schematic mimetic diagram illustrating an embodiment of a selective crystallization method.

Referring to FIG. 1, a first substrate 10 is disposed on a second substrate 20 with a predetermined gap $d_1$ therebetween.

Each of the first substrate 10 and the second substrate 20 may be a glass substrate, a quartz substrate, a silicon substrate, a silicon-on-insulator (SOI) substrate, a gallium arsenic substrate, a silicon germanium (SiGe) substrate, a ceramic substrate, a flexible substrate, or the like. The glass substrate may be made of barium borosilicate glass or aluminum borosilicate glass. The flexible substrate may be made of a material or a mixture of materials selected from cellulose triacetate (TAC), nylon, polyimide, polyethyleneterephthalate (PET), polybutyleneterephthalate (PBT), polysulfone, polycarbonate (PC), polyethersulfone (PES), polyetherketone (PEK), polyetheretherketone (PEEK), acryl, polyethylenenaphthalate (PEN), polyolefin, acrylic resin, styrene resin, and a copolymer of these materials. The first substrate 10 may be a transparent substrate through which a laser beam can pass.

A thickness $T_1$ of the first substrate 10 and a thickness $T_2$ of the second substrate 20 may be equal or different, and can be adjusted by those of ordinary skill in the art without departing from the spirit and scope of the present invention. The gap $d_1$ between the first substrate 10 and the second substrate 20 can affect the path of a laser beam and can be adjusted by those skilled in the art.

The first substrate 10 includes first crystallization regions 11 and a second non-crystallization region 12. The second substrate 20 includes second crystallization regions 21 and a second non-crystallization region 22. The first crystallization regions 11 and the second crystallization regions 21 are regions which are crystallized and on which thin-film transistors (TFTs) are formed in a subsequent process. The first non-crystallization region 12 and the second non-crystallization region 22 are regions on which pixel portions of a display device are formed. The first crystallization regions 11 and the second crystallization regions 21 may be made of amorphous silicon. Specifically, the crystallization regions 11 and 21 may be formed by depositing an amorphous silicon respectively on each of the first substrate 10 and the second substrate 20 using chemical vapor deposition (CVD) or sputtering, and patterning the amorphous silicon using a photolithography process.

The first substrate 10 and the second substrate 20 are placed such that the first crystallization regions 11 and the second crystallization regions 21 are arranged alternately without overlapping each other. In FIG. 1, the first substrate 10 and the second substrate 20 are placed such that the first crystallization regions 11 and the second crystallization regions 21 are arranged alternately. In other embodiments, two or more substrates can be crystallized in the same process.

Figure 2:
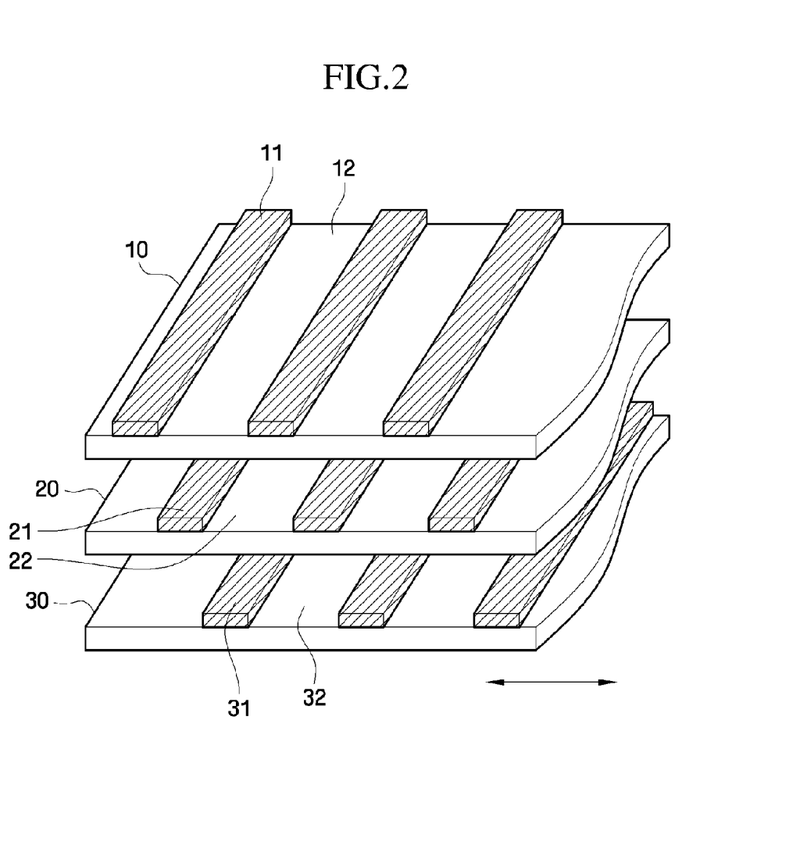
FIG. 2 is a schematic mimetic diagram illustrating a modified example of the arrangement of substrates in the selective crystallization method of FIG. 1.

Referring to FIG. 2, a first substrate 10, a second substrate 20 and a third substrate 30 may be stacked sequentially from the top down. The third substrate 30 includes third crystallization regions 31 and a third non-crystallization region 32. The first through third substrates 10 through 30 are placed such that first crystallization regions 11, second crystallization regions 21, and the third crystallization regions 31 do not overlap each other. Two or more substrates can be stacked sequentially as long as their crystallization regions do not overlap each other.

Referring to FIG. 1, the first crystallization regions 11 and the second crystallization regions 21 stacked above and below each other and arranged alternately are crystallized by a laser annealing process.

In a laser annealing process, a gas laser, a solid laser, or a metal laser may be used. In some embodiments, the gas laser may be an excimer laser, an Ar laser, a Kr laser, or a $CO_2$ laser. The solid laser may be a YAG laser, a $YVO_4$ laser, a YLF laser, a $YAlO_3$ laser, a ruby laser, an alexandrite laser, or a Ti sapphire laser. The metal laser may be a helium-cadmium laser. In other embodiments, the laser annealing process may be performed using an excimer pulse laser. The excimer pulse laser transmits strong short-wavelength energy in the form of a pulse. With the excimer pulse laser, high-speed crystallization is possible, and excellent crystalline properties can be obtained, which, in turn, improve device mobility. Improved device mobility helps improve the operating characteristics of a device.

The laser annealing process may be performed using a laser beam having a square beam spot 'X' of, for example, about 27.5 mn by about 0.4 mn on an irradiated surface. In other embodiments, a linear laser beam having a length of 10 mn or more may be used. The term 'linear' in the linear laser beam does not strictly refer to a linear shape but may refer to a rectangular or oval shape with a high aspect ratio. As the first substrate 10 and the second substrate 20 are moved in a first direction with respect to a fixed laser beam, the first crystallization regions 11 and the second crystallization regions 21 are alternately crystallized along the first direction. In other embodiments, as the laser beam is moved in the first direction with respect to the fixed first and second substrates 10 and 20, it crystallizes the first crystallization regions 11 and the second crystallization regions 21 in an alternating manner.

Hereinafter, another embodiment of a selective crystallization method will be described with reference to FIG. 3.

Figure 3:
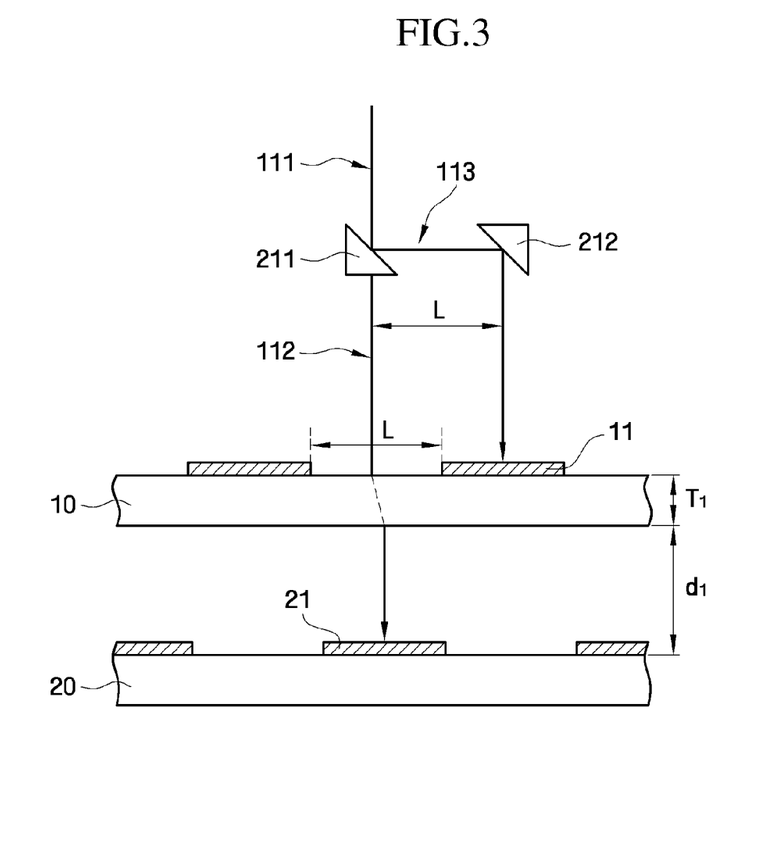
FIG. 3 is a schematic mimetic diagram illustrating another embodiment of a selective crystallization method.

The embodiment of selective crystallization method of FIG. 3 is similar to the selective crystallization method of FIG. 1 in that a first substrate 10 is disposed on a second substrate 20 with a predetermined gap $d_1$ therebetween and that first crystallization regions 11 and second crystallization regions 21 are crystallized with a laser beam. However, the illustrated methods are different in that in FIG. 3, a laser beam is split to simultaneously crystallize the first crystallization regions 11 and the second crystallization regions 21. Therefore, the following description will focus on this difference.

Referring to FIG. 3, a laser beam 111 is split into a first sub-laser beam 112 and a second sub-laser beam 113 before being irradiated to the first substrate 10 and the second substrate 20.

The laser beam 111 that passes through a laser oscillator (not shown) and an optical system (not shown) is split into the first sub-laser beam 112 and the second sub-laser beam 113 by a beam splitter 211. The second sub-laser beam 113 is at a predetermined angle to the first sub-laser beam 112. Either one of the first sub-laser beam 112 and the second sub-laser beam 113 is irradiated to the first substrate 10, and the other one is irradiated to the second substrate 20. The first sub-laser beam 112 may be part of the laser beam 111 which travels toward the second substrate 20 and may be irradiated to the second substrate 20 in a direction perpendicular to the second substrate 20. The second sub-laser beam 113 may be irradiated to the first substrate 10 after its path is altered by a reflector 212 in a direction perpendicular to the first substrate 10.

The reflector 212 is separated from a location at which the laser beam 111 is split by a distance equal to a gap L between the first crystallization regions 11. This helps to accurately irradiate light to the first crystallization regions 11. Accordingly, the first crystallization regions 11 and the second crystallization regions 21 are simultaneously crystallized by the second sub-laser beam 113 and the first sub-laser beam 112, respectively. The first crystallization regions 11 and the second crystallization regions 21 can be simultaneously crystallized using the same laser beam.

Figure 4:
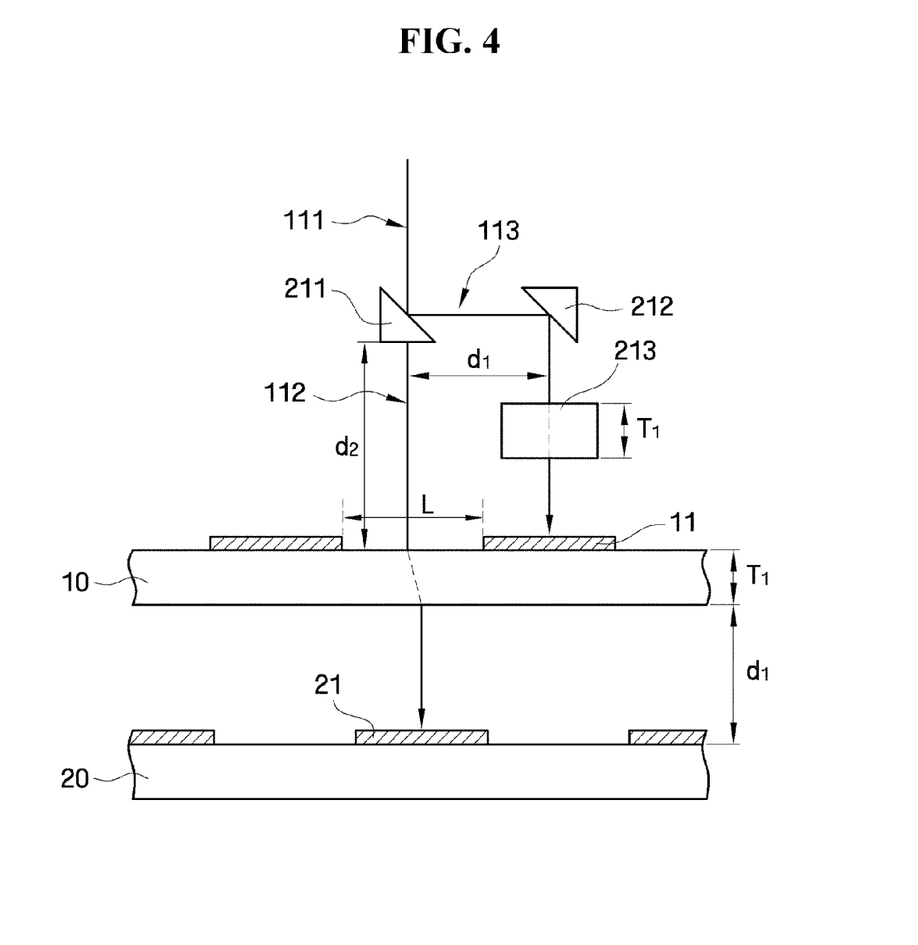
FIG. 4 is a schematic mimetic diagram illustrating another embodiment of a selective crystallization method.

Hereinafter, another embodiment of a selective crystallization method will be described with reference to FIG. 4. The selective crystallization method illustrated in FIG. 4 is the same as the selective crystallization method of FIG. 3, except that an optical path is altered. Therefore, the following description will focus on this difference.

Referring to FIG. 4, a laser beam 111 is split into a first sub-laser beam 112 and a second sub-laser beam 113 before being irradiated to a first substrate 10 and a second substrate 20. Either one of the first sub-laser beam 112 and the second sub-laser beam 113 is irradiated to the first substrate 10, and the other one is irradiated to the second substrate 20. In the embodiment of FIG. 4, an optical path of a sub-laser beam irradiated to the first substrate 10 is adjusted to be the same as the optical path of a sub-laser beam irradiated to the second substrate 20.

The laser beam 111 that passes through a laser oscillator (not shown) and an optical system (not shown) is split into the first sub-laser beam 112 and the second sub-laser beam 113, which is at a predetermined angle to the first sub-laser beam 112, by a beam splitter 211. The first sub-laser beam 112 is irradiated to the second substrate 20 in a direction perpendicular to the second substrate 20. The second sub-laser beam 113 is irradiated to the first substrate 10 after its path is altered by a reflector 212 in a direction perpendicular to the first substrate 10.

The reflector 212 is separated from the beam splitter 211 by a distance $d_1$ equal to a gap $d_1$ between the first substrate 10 and the second substrate 20. For accurate irradiation of the second sub-laser beam 113 to first crystallization regions 11, the gap $d_1$ may be similar to a gap L between the first crystallization regions 11. The first substrate 10 and the second substrate 20 may be arranged above and below each other with a gap similar to a gap between crystallization regions.

As the second sub-laser beam 113 passes through a refractive film 213 having the same thickness $T_1$ and refractive index as the first substrate 10, its optical path is adjusted to be the same as that of the first sub-laser beam 112. The first sub-laser beam 112 that passes through the beam splitter 211 follows an optical path of $d_2+T_1+d_1$ to reach the second substrate 20. The second sub-laser beam 113 is irradiated to the first substrate 10 directly. Therefore, the first sub-laser beam 112 and the second sub-laser beam 113 have different optical paths. However, the optical path of the second sub-laser beam 113 is adjusted to be the same as that of the first sub-laser beam 112 by the reflector 212 which is separated from the beam splitter 211 by the distance $d_1$ and the refractive film 213 which has the same thickness $T_1$ and the refractive index as the first substrate 10. Accordingly, the first crystallization regions 11 are crystallized by the second sub-laser beam 113 having the same optical path as that of the first sub-laser beam 112. Therefore, the first and second crystallization regions 11 and 21 can be crystallized uniformly as well as simultaneously.

As described above, since two or more substrates can be crystallized in the same process using the embodiments of crystallization method described, productivity of the crystallization process can be improved. In addition, a plurality of substrates can be crystallized uniformly as well as simultaneously by adjusting an optical path.

Hereinafter, an embodiment of a laser crystallization apparatus will be described with reference to FIG. 5.

Figure 5:
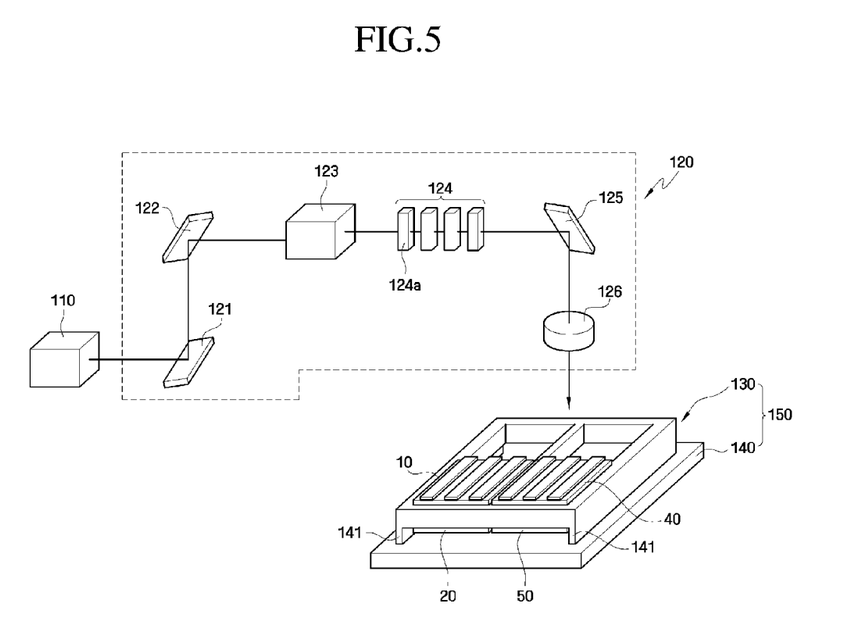
FIG. 5 is a schematic mimetic diagram of an embodiment of a laser crystallization apparatus.

Referring to FIG. 5, an embodiment of the laser crystallization apparatus includes a laser oscillator 110, an optical system 120, and a stage 150.

The laser oscillator 110 generates a laser beam. In FIG. 5, one laser oscillator 110 is illustrated. However, in other embodiments, a plurality of laser oscillators 110 may be used. In such embodiments, the laser oscillators 110 may use the same or different lasers, and their wavelengths may also be the same or different.

In various embodiments, a gas laser, a solid laser, or a metal laser may be used. The gas laser may be an excimer laser, an Ar laser, or a Kr laser. The solid laser may be a laser using crystals such as YAG, $YVO_4$, YLF or $YAlO_3$ doped with Cr, Nd, Er, Ho, Ce, Co, Ti, Yb or Tm. An ultraviolet laser beam obtained by converting an infrared laser beam generated from a solid laser into a green laser beam using a nonlinear optical device and processing the green laser beam into the ultraviolet laser beam using another nonlinear optical device may be used.

A beam spot of a laser beam oscillated by the laser oscillator 110 may be, but is not limited to, rectangular or oval. The shape of the beam spot may vary according to the type of laser, and the beam spot can also be shaped by the optical system 120.

The optical system 120 processes an unprocessed laser beam emitted from the laser oscillator 110 to have a shape and energy density suitable for use in crystallization of a semiconductor film. The optical system 120 may include a plurality of optical elements performing these functions. Referring to FIG. 5, the optical system 120 includes reflectors 121, 122 and 125, an attenuator 123, a homogenizer 124, and a projection lens 126. In other embodiments, some of the above optical elements can be omitted from the optical system 120, or additional optical elements can be added to the optical system 120 as desired by those of ordinary skill in the art. One or more of a pulse duration extender, a beam splitter, or a condenser lens can be added to the optical system 120 in some embodiments.

The reflectors 121, 122 and 125 are located on an optical path of a laser beam and change the optical path of the laser beam such that a final laser beam is irradiated to a surface of a substrate. In some embodiments, the reflectors 121, 122 and 125 may be total internal reflection mirrors. In FIG. 5, three total internal reflection mirrors 121,122 and 125 are used. In other embodiments, the number of mirrors can be changed.

The attenuator 123 adjusts the energy density of a laser beam and can be used together with a pulse duration extender (not shown). Crystal growth is related to the duration of a laser beam pulse. The pulse duration extender extends the pulse duration of a laser beam.

The homogenizer 124 homogenizes the energy density of a laser beam. The homogenizer 124 may consist of, but is not limited to, two pairs of lens arrays 124a. The projection lens 126 synthesizes and enlarges a processed laser beam and projects the synthesized and enlarged laser beam onto an object.

The stage 150 includes an upper stage 130 and a lower stage 140. The upper stage 130 and the lower stage 140 may or may not be coupled to each other. The upper stage 130 and the lower stage 140 may be the same size, or the lower stage 140 may be larger than the upper stage 130.

A plurality of upper substrates 10 and 40 may be mounted on the upper stage 130, and a plurality of lower substrates 20 and 50 may be mounted on the lower stage 140. The upper substrates 10 and 40 may be disposed on the lower substrates 20 and 50 with a predetermined gap therebetween.

The stage 150 can move along X and Y axes in synchronization with irradiation of a laser beam. Along a direction in which the stage 150 moves, first crystallization regions 11 and second crystallization regions 21 of the first substrate 10 and the second substrate 20 are crystallized alternately and/or simultaneously.

The upper stage 130 and the lower stage 140 may be made of glass, quartz, ceramic, plastic, or the like. The upper stage 130 and the lower stage 140 may be heat-resistant enough to withstand an irradiated laser beam, and the upper stage 130 may be transparent to transmit a laser beam.

Figure 6:
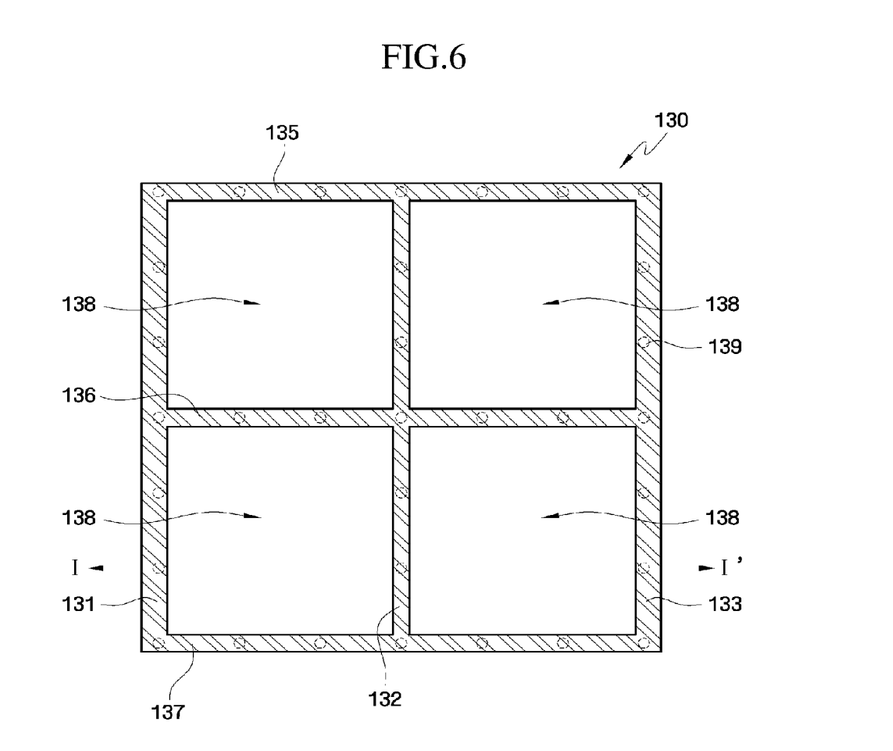
FIG. 6 is a plan view of an upper stage of the laser crystallization apparatus of FIG. 5.
Figure 7:
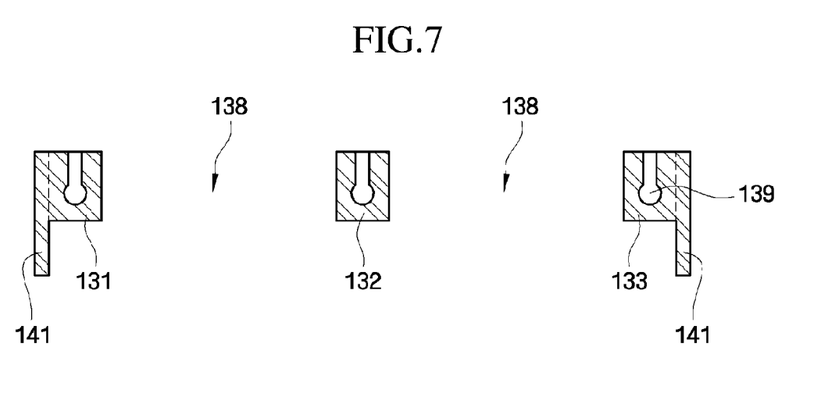
FIG. 7 is a cross-sectional view taken along the line I-I' of FIG. 6.
Figure 8:
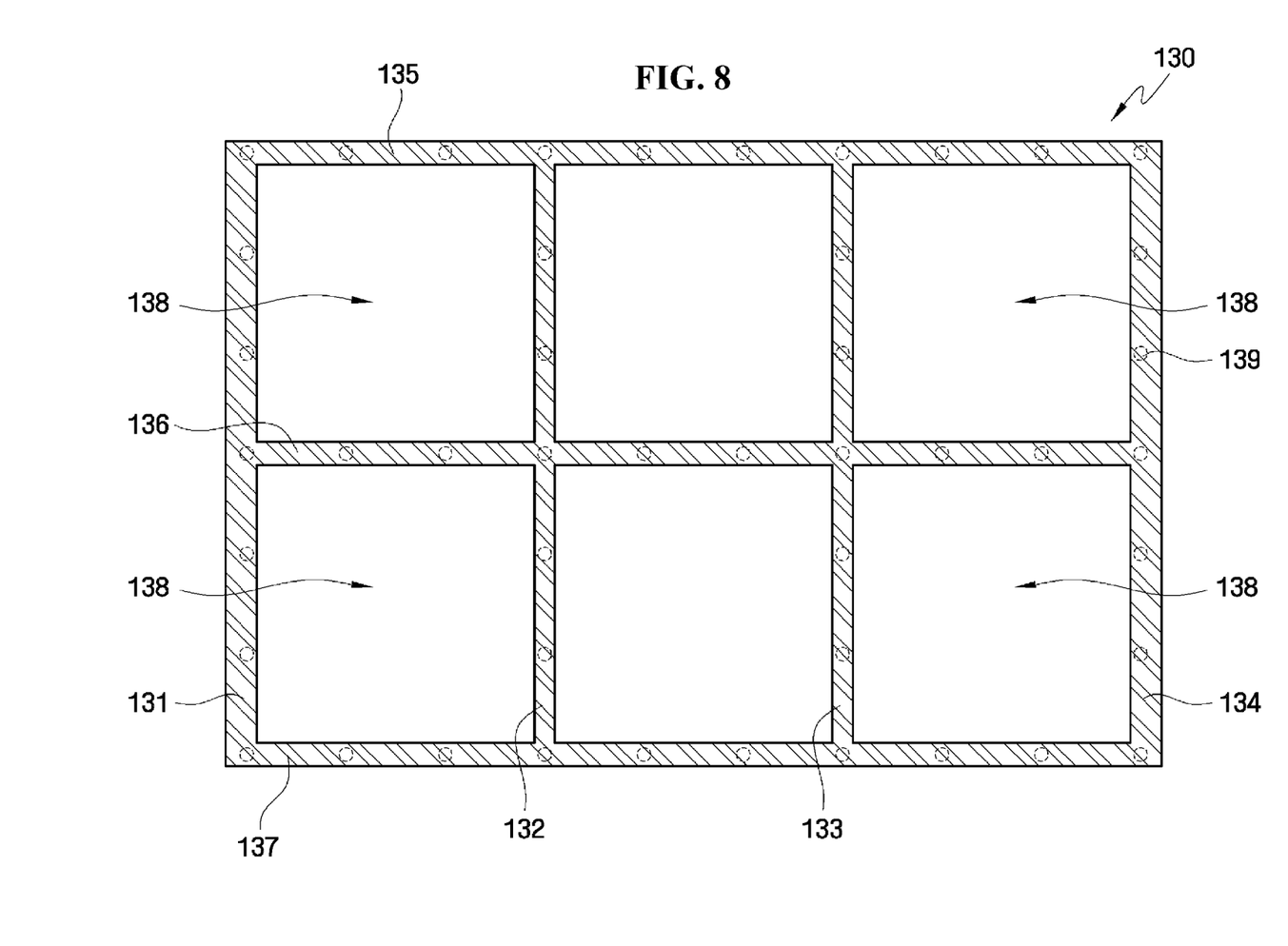
FIG. 8 shows a modified example of the upper stage of FIG. 5.

The stage 150 of the laser crystallization apparatus of FIG. 5 will now be described in greater detail with reference to FIGS. 6 through 8. FIG. 6 is a plan view of the upper stage 130 of the laser crystallization apparatus of FIG. 5. FIG. 7 is a cross-sectional view taken along the line I-I' of FIG. 6. FIG. 8 shows a modified example of the upper stage 130 of the laser crystallization apparatus of FIG. 5.

Referring to FIGS. 6 and 7, the upper stage 130 may be rectangular or square and may include a plurality of first supports 131 through 133, a plurality of second supports 135 through 137, light transmission portions 138, and spacers 141.

The first supports 131 through 133 extend parallel to each other in a first direction and are separated from each other by a predetermined distance. The second supports 135 through 137 extend parallel to each other in a second direction perpendicular to the first direction and are separated from each other by a predetermined distance. The first supports 131 through 133 and the second supports 135 through 137 are situated between the upper substrates 10 and 40 and the lower substrates 20 and 50.

The first supports 131 through 133 include two first lateral supports 131 and 133 formed on side surfaces of the upper stage 130 and a first central support 132 formed between the first lateral supports 131 and 133. The second supports 135 through 137 include two second lateral supports 135 and 137 formed on side surfaces of the upper stage 130 and a second central support 136 formed between the second lateral supports 135 and 137.

The light transmission portions 138 are rectangular or square empty spaces and are formed by the intersections of the first supports 131 through 133 and the second supports 135 through 137. Referring to FIG. 6, three first supports 131 through 133 and three second supports 135 through 137 intersect each other to form four light transmission portions 138. The upper substrates 10 and 40 are mounted on the upper stage 130 to overlap the light transmission portions 138. Since the upper stage 130 includes four light transmission portions 138 in FIG. 5, four upper substrates can be mounted on the upper stage 130. Specifically, end portion of the first substrate 10 are placed on the first lateral support 131, the first central support 132, the second lateral support 137 and the second central support 136 to overlap one of the light transmission portions 138.

A plurality of vacuum holes 139 are formed in the first supports 131 through 133 and the second supports 135 through 137. The vacuum holes 139 are cylindrical or spherical and support the upper substrates 10 and 40 to prevent them from sagging under their own weight. Therefore, a predetermined gap can be maintained between the upper substrates 10 and 40 and the lower substrates 20 and 50.

The lower stage 140 is rectangular or square. The lower stage 140 may have the same shape as the upper stage 130. In various embodiments, the lower stage 140 can have any shape as long as it can allow a substrate to be mounted thereon. The lower stage 140 may be the same size as the upper stage 130 or may be larger than the upper stage 130.

The lower substrates 20 and 50 are mounted on the lower stage 140 and are overlapped by the light transmission portions 138 of the upper stage 130. Accordingly, a laser beam passing through the upper substrates 10 and 40 can reach the lower substrates 20 and 50 on the lower stage 140 without being interrupted by the upper stage 130.

The spacers 141 are integrally formed with the first lateral supports 131 and 133 and/or the second lateral supports 135 and 137 on edges of the upper stage 130. The spacers 141 extend from the first lateral supports 131 and 133 and/or the second lateral supports 135 and 137 in the direction of the lower stage 140 to be connected to the lower stage 140. In FIG. 7, the spacers 141 are formed on the first lateral supports 131 and 133.

The spacers 141 extend longer than the first lateral supports 131 and 133 and the second lateral supports 135 and 137 in a lengthwise direction to be in contact with the lower stage 140. Therefore, the spacers 141 create a space between the lower stage 140 and the upper stage 130, and the lower substrates 20 and 50 are placed in the space. The spacers 141 may be made of the same material as the first lateral supports 131 and 133 and/or the second lateral supports 135 and 137.

In FIG. 6, the upper stage 130 has four light transmission portions 138. In other embodiments, the number of light transmission portions formed in the upper stage 130 may be adjusted by those skilled in the art according to the size of a panel. Referring to FIG. 8, the upper stage 130 may include six light transmission portions 138. The upper stage 130 includes a plurality of first supports 131 through 134 in the first direction and a plurality of second supports 135 through 137 in the second direction. The first supports 131 through 134 include two first lateral supports 131 and 134 extending parallel to each other in the first direction and two first central supports 132 and 133 formed between the first lateral supports 131 and 134. The second supports 135 through 137 includes second lateral supports 135 and 137 formed in the second direction perpendicular to the first direction and a second central support 136 formed between the second lateral supports 135 and 137. The first supports 131 through 134 and the second supports 135 through 137 intersect each other to form the six light transmission portions 138.

Hereinafter, another embodiment of a laser crystallization apparatus will be described with reference to FIG. 9. The embodiment of the laser crystallization apparatus in FIG. 9 has the same configuration as the embodiment of a laser crystallization apparatus of FIG. 5, except that it further includes a beam splitter 211 and a reflector 212. Therefore, the following description will focus on the beam splitter 211 and the reflector 212. Like reference numerals in the drawings generally denote like elements, and thus their description will be omitted.

Figure 9:
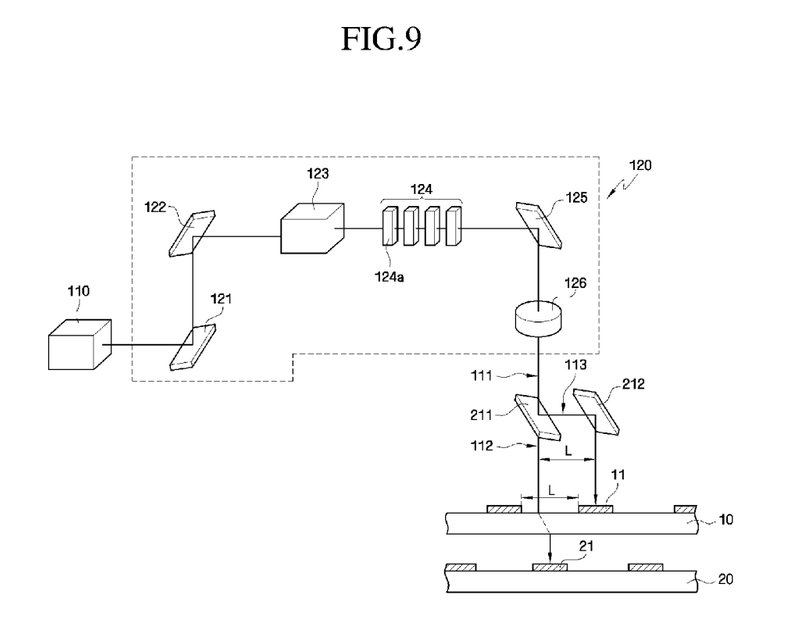
FIG. 9 is a schematic mimetic diagram of another embodiment of a laser crystallization apparatus.

Referring to FIG. 9, the embodiment of a laser crystallization apparatus includes a laser oscillator 110, an optical system 120, the beam splitter 211, and the reflector 212.

The beam splitter 211 splits a laser beam 111 that passes through the optical system 120 into a first sub-laser beam 112 travelling toward a second substrate 20 and a second sub-laser beam 113 which is at a predetermined angle to the first sub-laser beam 112. The first sub-laser beam 112 may crystallize second crystallization regions 21 on the second substrate 20 by applying energy to the second crystallization regions 21 and the second sub-laser beam 113 may crystallize the first crystallization regions 11 on the first substrate 10.

In some embodiments, the beam splitter 211 may split the laser beam 111 such that the energy density of the first sub-laser beam 112 and that of the second sub-laser beam 113 are at a ratio of 1:1. A semi-transmissive mirror may be used as the beam splitter 211. In other embodiments, any beam splitter known to those skilled in the art can be used.

The reflector 212 adjusts an optical path of the second sub-laser beam 113 such that the second sub-laser beam 113 can be irradiated to a first substrate 10. The reflector 212 adjusts the optical path of the second sub-laser beam 113 such that the second sub-laser beam 113 can be irradiated to first crystallization regions 11 in a direction perpendicular to the first crystallization regions 11. The reflector 212 may be a total internal reflection mirror.

The reflector 212 may be separated from the beam splitter 211 by a distance equal to a gap L between the first crystallization regions 11. The first sub-laser beam 112 and the second sub-laser beam 113 are separated from each other by a distance equal to the gap L between the first crystallization regions 11. Thus, the second sub-laser beam 113 can be irradiated to a central portion of each of the first crystallization regions 11.

As described above, the laser beam 111 is split into the first sub-laser beam 112 and the second sub-laser beam 113, and the optical path of the second sub-laser beam 113 is adjusted. Accordingly, the first sub-laser beam 112 and the second sub-laser beam 113 are simultaneously irradiated to the second crystallization regions 21 and the first crystallization regions 11, respectively, thereby simultaneously crystallizing the first crystallization regions 11 on the first substrate 10 and the second crystallization regions 21 on the second substrate 20.

Hereinafter, another embodiment of a laser crystallization apparatus will be described with reference to FIG. 10. The embodiment of the laser crystallization apparatus of FIG. 10 has the same configuration as the embodiment of the laser crystallization apparatus of FIG. 9, except that it further includes a refractive film 213. Therefore, the following description will focus on the refractive film 213. Like reference numerals in the drawings generally denote like elements, and thus their description will be omitted.

Figure 10:
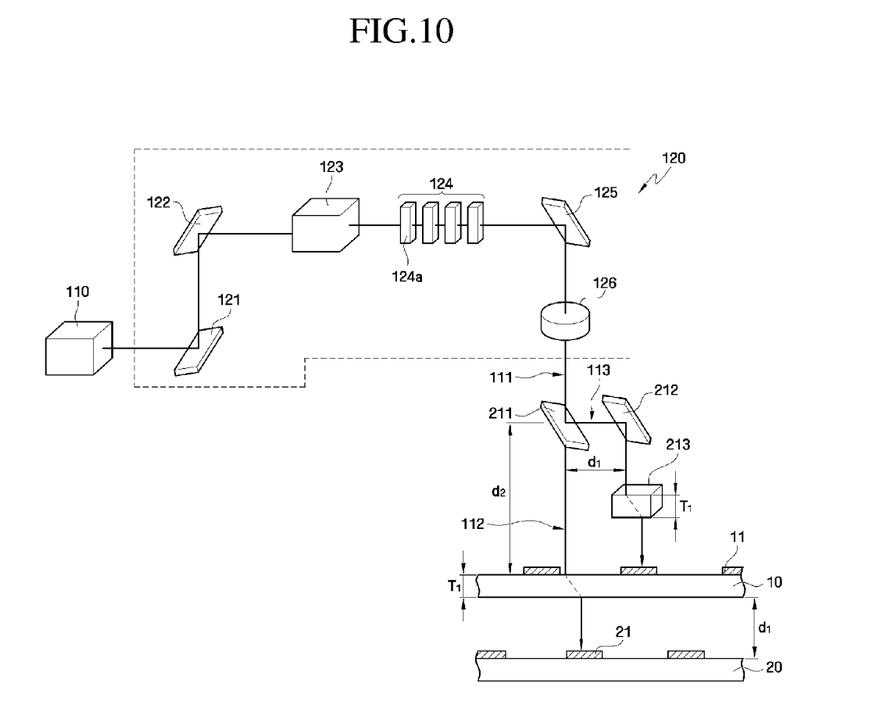
FIG. 10 is a schematic mimetic diagram of another embodiment of a laser crystallization apparatus.

Referring to FIG. 10, the embodiment of the laser crystallization apparatus includes a laser oscillator 110, an optical system 120, a beam splitter 211, a reflector 212 and the refractive film 213.

The reflector 212 is placed on an optical path of a second sub-laser beam 113 produced by the beam splitter 211. The reflector 212 may be separated from the beam splitter 211 by a distance $d_1$ equal to a gap $d_1$ between a first substrate 10 and a second substrate 20 disposed under the first substrate 10.

The refractive film 213 is placed on the optical path of the second sub-laser beam 113 produced by the beam splitter 211 and situated behind the reflector 212. The refractive film 213 has the same thickness $T_1$ and refractive index as the first substrate 10. As the second sub-laser beam 113 passes through the refractive film 213, it is refracted and thus has the same optical path as that of a first sub-laser beam 112.

The first sub-laser beam 112 that passes through the beam splitter 211 follows an optical path of $d_2+T_1+d_1$ to reach the second substrate 20. The second sub-laser beam 113 passes through the reflector 212 which is separated from the beam splitter 211 by the distance $d_1$ and the refractive film 213 which has the same thickness $T_1$ and refractive index as the first substrate 10. Thus, the second sub-laser beam 113 also has an optical path of $d_2+T_1+d_1$. Since the first sub-laser beam 112 and the second sub-laser beam 113 are made to have the same optical path by the laser crystallization apparatus, the first substrate 10 and the second substrate 20 can be crystallized uniformly.

Hereinafter, another embodiment of the laser crystallization apparatus will be described with reference to FIG. 11. The laser crystallization apparatus of FIG. 11 has the same configuration as the laser crystallization apparatus of FIG. 10, except that it further includes projection lenses 126 and 127. Therefore, the following description will focus on the projection lenses 126 and 127. Like reference numerals in the drawings generally denote like elements, and thus their description will be omitted.

Figure 11:
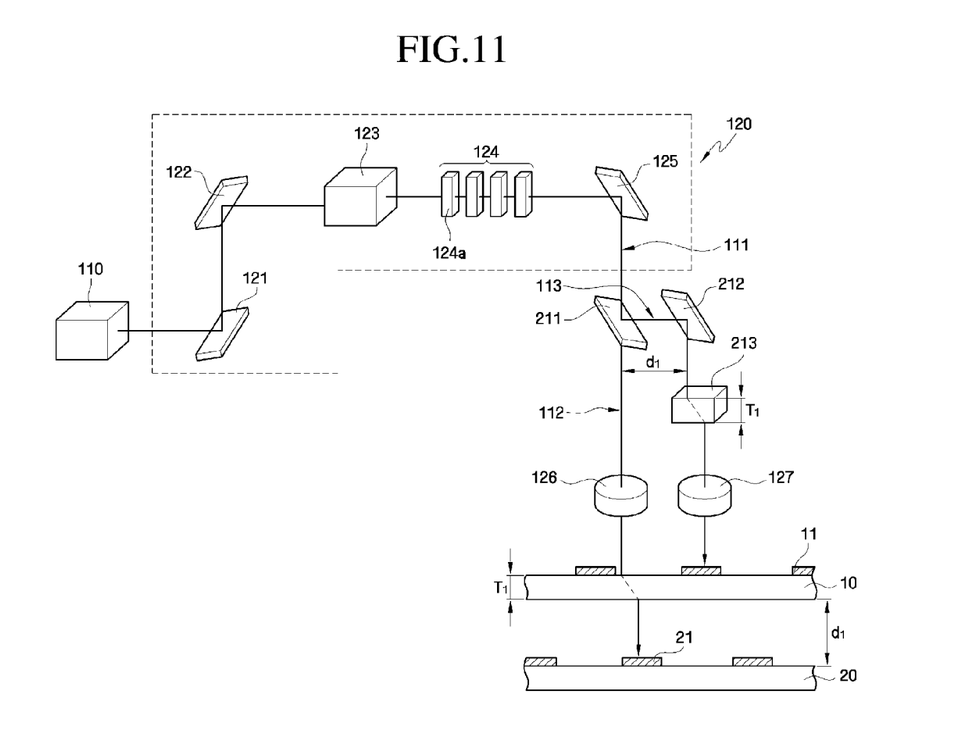
FIG. 11 is a schematic mimetic diagram of another embodiment of a laser crystallization apparatus.

Referring to FIG. 11, an embodiment of the laser crystallization apparatus includes a laser oscillator 110, an optical system 120, a beam splitter 211, a reflector 212, a refractive film 213, and the projection lenses 126 and 127.

The projection lenses 126 and 127 are respectively located at final positions on optical paths of a first sub-laser beam 112 and a second sub-laser beam 113 and cause the first sub-laser beam 112 and the second sub-laser beam 113 to be irradiated onto a second substrate 20 and a first substrate 10 at maximum energy densities, respectively.

Since the projection lenses 126 and 127 are respectively located at the final positions on the optical paths of the first sub-laser beam 112 and the second sub-laser beam 113, no additional projection lens is required in the optical system 120. In various embodiments, the projection lenses 126 and 127 are optional and can be omitted as desired by those skilled in the art.

As described above, embodiments of a laser crystallization apparatus simultaneously crystallize a plurality of substrates in a single process. This reduces the time required for the crystallization process and improves productivity of the crystallization process. In addition, the laser crystallization apparatus adjusts an optical path of a laser beam to uniformly crystallize a plurality of substrates.

A laser crystallization apparatus and a selective crystallization method are used to selectively crystallize a substrate. TFTs are formed on the substrate, and the TFTs can be used in optical devices and apparatuses such as liquid crystal displays and organic light-emitting displays.

While the present invention has been particularly shown and described with reference to certain embodiments thereof, it may, however, be embodied in many different forms and should not be construed as being limited to the embodiments. It will be understood by those of ordinary skill in the art that various changes in form and detail may be made therein without departing from the spirit and scope of the present invention as defined by the following claims. The embodiments should be considered in a descriptive sense only and not for purposes of limitation.

What is claimed is:

1. A selective crystallization method comprising:
    placing a first substrate on a second substrate, wherein the first substrate comprises first crystallization regions and the second substrate comprises second crystallization regions, such that the first crystallization regions and the second crystallization regions do not overlap each other; and
    crystallizing the first and second crystallization regions with a single laser beam.

2. The method of claim 1, wherein at least one of the first substrate and the second substrate is transparent.

3. The method of claim 1, wherein crystallizing the first and second crystallization regions comprises at least one of moving the single laser beam in a first direction, or moving the first substrate and the second substrate in the first direction.

4. The method of claim 1, wherein the first crystallization regions and the second crystallization regions comprise an amorphous silicon.

5. A selective crystallization method comprising:
    placing a first substrate, the first substrate having first crystallization regions, on a second substrate, the second substrate having second crystallization regions, such that the first crystallization regions and the second crystallization regions are arranged alternately; and
    simultaneously crystallizing the first crystallization regions and the second crystallization regions by irradiating a laser beam to the first substrate and the second substrate,
    wherein the laser beam is split into a first sub-laser beam and a second sub-laser beam which are simultaneously irradiated to the first crystallization regions and the second crystallization regions.

6. The method of claim 5,
    the laser beam is split into the first sub-laser beam which travels toward the second substrate and the second sub-laser beam which is at a predetermined angle to the first sub-laser beam, and
    the first sub-laser beam is irradiated to the second crystallization regions, and the second sub-laser beam is reflected toward the first substrate to reach the first crystallization regions.

7. The method of claim 5, wherein the first sub-laser beam is irradiated to the second crystallization regions, the second sub-laser beam is irradiated to the first crystallization regions, and an optical path of the second sub-laser beam is adjusted to be the same as that of the first sub-laser beam.

8. The method of claim 7, wherein
    the second sub-laser beam travels a distance equal to the predetermined distance between the first substrate and the second substrate from a location at which the laser beam is split;
    the second sub laser beam is reflected toward the first substrate; and
    the second sub laser beam passes through a refractive film having a same thickness and refractive index as the first substrate.

9. The method of claim 5, wherein the first and the second crystallization regions comprise amorphous silicon.

10. The method of claim 5, wherein at least one of the first substrate and the second substrate is transparent.

* * * * *